United States Patent [19]

Heiss, Jr. et al.

[11] 4,089,704

[45] May 16, 1978

[54] REMOVAL OF RTV SILICON RUBBER ENCAPSULANTS

[75] Inventors: John Herbert Heiss, Jr., Bethlehem, Pa.; John Robert Wylie, North Andover, Mass.

[73] Assignees: Bell Telephone Laboratories, Incorporated, Murray Hill, N.J.; Western Electric Company Inc., New York, N.Y.

[21] Appl. No.: 754,098

[22] Filed: Dec. 27, 1976

[51] Int. Cl.² ........................................... H01L 23/30
[52] U.S. Cl. .......................................... 134/29; 134/30; 156/657; 156/668; 252/79.5
[58] Field of Search ...................... 156/655, 668, 657; 252/79.5, 156, 158, DIG. 8; 134/38, 29, 30; 29/575, 588

[56] References Cited

U.S. PATENT DOCUMENTS

| | | | |
|---|---|---|---|
| 2,710,843 | 6/1955 | Stebleton | 252/158 |
| 3,551,204 | 12/1970 | Bolger et al. | 252/158 |
| 3,673,099 | 6/1972 | Corby et al. | 252/156 |
| 3,915,769 | 10/1975 | Moore | 156/665 |
| 3,947,952 | 4/1976 | Miller et al. | 156/668 |
| 3,969,813 | 7/1976 | Minetti et al. | 29/575 |
| 4,017,495 | 4/1977 | Jaffe et al. | 29/588 |

OTHER PUBLICATIONS

Rose et al., Ed. *The Condensed Chemical Dictionary*, 7th ed, Reinhold Publishing Corp., New York, N.Y. (1966), p. 844.

*Primary Examiner*—David Klein
*Assistant Examiner*—Jerome W. Massie
*Attorney, Agent, or Firm*—Lester H. Birnbaum

[57] ABSTRACT

Disclosed is a method of removing silicone rubber encapsulating material from micro-electronic circuits. The encapsulant is broken down molecularly and removed by a solution of tetramethyl-ammonium hydroxide which is diluted with an alcohol such as 2-propanol. It was found that this stripping solution causes minimal swelling of the encapsulant and leaves no significant residue which cannot be removed by standard rinsing.

6 Claims, 2 Drawing Figures

REMOVAL OF RTV SILICON RUBBER ENCAPSULANTS

BACKGROUND OF THE INVENTION

This invention relates to the fabrication of circuits on insulating substrates, and in particular to a method of removing encapsulating material from said circuits.

Micro-electronic circuits, where many small circuit elements are formed on an insulating substrate, have found increasing use in modern technology. In particular, hybrid integrated circuits, employing a combination of thin film elements and silicon integrated circuit chips bonded on a single substrate, have developed in size and complexity for uses such as in memories and microwave transmission systems. In order to protect the components, the circuit is often covered by an RTV (Room Temperature Vulcanizing) silicone rubber which cures by reaction with moisture in the air. One of the problems associated with this technology is the fact that some of such circuits require diagnosis subsequent to forming the encapsulating material thereon, and the circuits are often found defective. Since many of these circuits are expensive, it is not economical to discard them, and repair is desirable.

There are primarily two methods of repair available in the art. If a failed component can be located underneath the opaque encapsulant, selective mechanical removal can be effected such as by peeling off the encapsulant over the defective component. (See, for example, U.S. patent application of Mancke and Soos, Ser. No. 727,057.) This procedure may be difficult if the encapsulant does not possess sufficient cohesive strength and/or has very high adhesive forces. A high pressure water jet technique may also be used to remove the encapsulant and a defective silicon device in one operation. (See, e.g., U.S. Pat. No. 3,969,813 issued to Minetti and Strickland.) This operation is not generally practical for removal of a defective crossover from a cluster or for multiple device repairs.

The second method of removal involves complete chemical stripping of the encapsulant. A problem arises in using many of such stripping solutions when the circuit includes components raised from the surface of the substrate, as when semiconductor chips are bonded to the substrate with beam leads. Specifically, the encapsulant under the chip tends to swell, causing unacceptable stresses on the leads resulting in mechanical and electrical failures. A further problem with many solutions is an adverse effect on insulation resistance. Although milder solutions were found to decrease the swelling, they usually involved too long a time for removal to be practical in a commercial process. Furthermore, it was found that most solutions left a visible residue which could not be removed even after long exposures. This tended to cause subsequent repair bonding to be ineffective and also produce inordinately high leakage currents across the substrate surface.

It is therefore a primary object of the invention to remove the encapsulant from hybrid integrated circuits without leaving significant residue or causing swelling of the encapsulant which results in damage to the components of the circuit. It is a further object of the invention to effect such removal in a period of time which is commercially practicable.

SUMMARY OF THE INVENTION

These and other objects are achieved in accordance with the invention. In accordance with one aspect, RTV silicone rubber encapsulants are removed by exposing to a stripping solution including tetramethylammonium hydroxide and an alcohol having at least two carbon atoms in its molecular structure. In a more specific aspect the tetramethylammonium hydroxide is first dissolved in methanol and then diluted with 2-propanol. It was found that this removal resulted in minimal swelling and residue remaining so that circuits could be repaired and re-encapsulated without degrading their reliability.

BRIEF DESCRIPTION OF THE DRAWING

These and other features of the invention are delineated in detail in the following description. In the drawing.

It should be understood that for purposes of illustration, these figures are not made to scale.

DETAILED DESCRIPTION OF THE INVENTION

Figure 1:
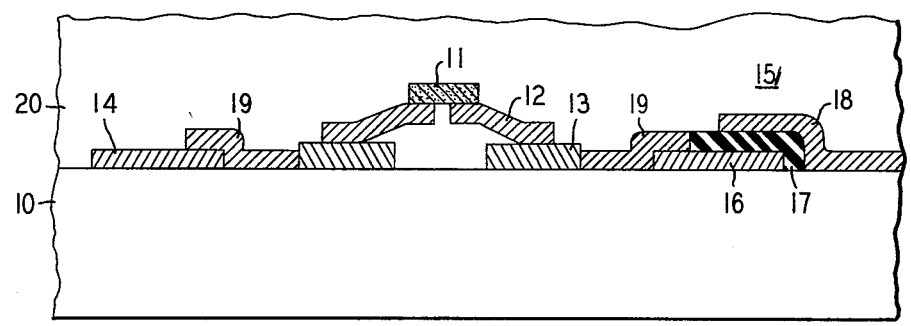
FIG. 1 is a cross-sectional view of a portion of a hybrid integrated circuit which may utilize the the method of the present invention.

FIG. 1 illustrates a portion of a typical encapsulated hybrid integrated circuit which may utilize the method of the invention. It should be realized that this circuit is presented purely for illustrative purposes and no limitation should be implied from this example. It will be further realized that an actual circuit would include many more elements than those shown.

The circuit is formed on an insulating substrate, 10, which is typically ceramic. A silicon integrated circuit chip, 11, with beam lead electrical connections, 12, is bonded to bonding pads 13 on the substrate. It will be noted that the bonding results in the chip being raised above the surface of the substrate. The circuit also includes, illustratively, a resistor element, 14, typically comprising a film of tantalum nitride, and a capacitor element, 15, which may comprise a tantalum electrode 16, an insulating film, 17, of tantalum oxide, and a counter-electrode 18 of chromium-palladium-gold. Interconnect metal, 19, which may be titanium-palladium-gold is also shown. Essentially the entire circuit is covered with an encapsulant, 20, which is typically an RTV (room temperature vulcanizing) silicone rubber which cures by reaction with moisture. Such encapsulants basically comprise siloxanes with a variety of active end groups for cross-linking. The thickness of encapsulant is usually in the range 0.007–0.025 inches.

Subsequent to encapsulation, the circuit is tested, and it may be found that one or more components is defective. It is therefore necessary to remove the encapsulant, replace the defective component and re-encapsulate without degrading circuit performance.

In accordance with the invention, a stripping solution is provided for removing the encapsulant from the entire circuit which solution comprises a tetramethylammonium hydroxide solution dissolved in an alcohol having at least 2 carbon atoms in its molecular structure. In accordance with one embodiment of the invention, the material comprises tetramethylammonium hydroxide and methanol dissolved in 2-propanol. As described more fully below, use of this solution resulted in minimal swelling and no significant residue on the circuits.

Various types of hybrid integrated circuits were employed for encapsulant removal. The circuits were encapsulated with RTV encapsulants comprising a siloxane polymer with methoxy end groups, such as those sold by Dow Corning under the trade names DC 96-084 and DC Q3-6550 dispersions, and DC-3144 and DC-3145 adhesive sealants. These materials generally include the siloxane polymer, a silica filler, carbon black, titanium dioxide, and a catalyst. However, the invention should be applicable to all types of RTV silicone rubbers. The thickness of the encapsulant ranged from 0.007 to 0.025 inches.

Figure 2:
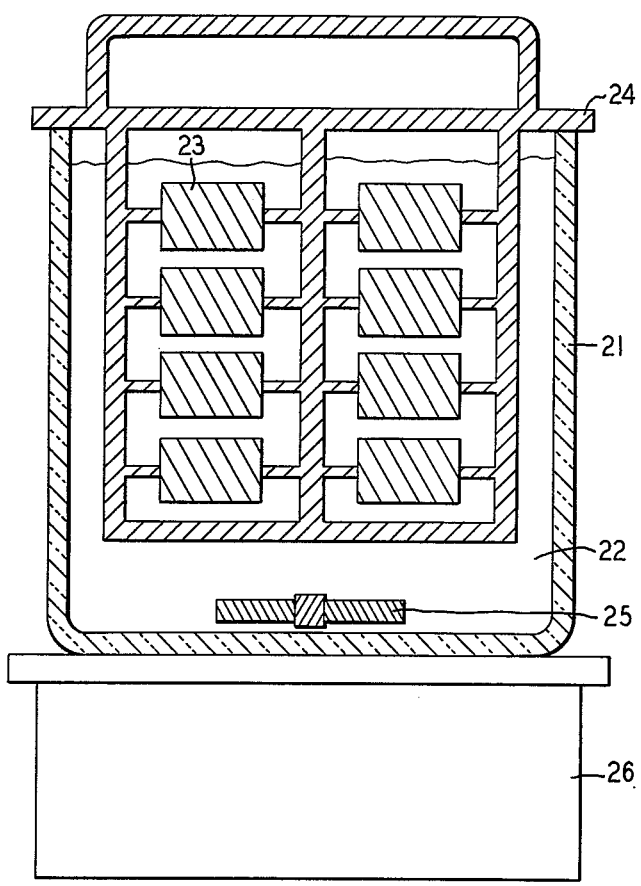
FIG. 2 is a cross-sectional view of suitable apparatus for practicing the method of the present invention in accordance with one embodiment.

In order to remove the encapsulant, as shown in FIG. 2, the circuits, 23, were placed in a substrate holding fixture, 24, and were immersed in a standard glass or stainless steel tank, 21. Included in the tank is a means for agitating the solution such as a magnetic spinner 25. Also provided is a commercially available combination hot-plate and stirrer 26 which maintains the solution at the desired temperature and causes the spinning of magnet 25.

The stripping solution was prepared by starting with a solution of 24% by volume of tetramethylammonium hydroxide in methanol (sold by Matheson, Coleman & Bell) and diluting with 2-propanol in concentrations ranging from 1 part by volume tetramethylammonium hydroxide solution and 1 part by volume 2-propanol (12.0% by volume of tetramethylammonium hydroxide) to 1 part tetramethylammonium hydroxide solution and 100 parts 2-propanol (0.24% by volume of tetramethylammonium hydroxide). The temperature of the solution ranged from 25° C (room temperature) to 55° C. Mild agitation of the solution was provided and the rate of stirring was not critical. When the encapsulant appeared to be removed by normal visual examination (45 minutes –6 hours), the circuits were removed from the stripping solution, drained, and immersed in a second, non-contaminated stripping solution of the same composition until there was no visual evidence of residual encapsulant remaining (1–2 hours). Use of the second stripping solution is desired to insure removal of all the encapsulant. The circuits were than immersed in separate rinsing solutions of ispropyl alcohol for approximately two minutes each to wash off any tetramethylammonium hydroxide which might remain on the circuits.

It was noted during these procedures that the dissolved encapsulant resembled a syrupy, viscous liquid which did not appear to redeposit on the surface of the circuit. Consequently, no significant residue was left on the circuit after final rinsing.

The effect of the encapsulant removal on swelling and lifting of the silicon integrated circuit chips was also noted. Initial tests on a substrate with only ten beam-leaded chips showed that after removal of the encapsulant at 38° C for 6 hours, the average height of the chips above the substrate increase by only 1.4%, while at a temperature of 54° C, the average increase was 2.7%. On actual working circuits, the encapsulant was removed in 1:10 tetramethylammonium solution —
2-propanol (2.2% of tetramethylammonium hydroxide) for 6 hours at 38°C and re-encapsulated. The circuits were placed on a thermal cycle test from −40° to 150° C and tested for mechanical failure. It was discovered that the failure rate of the circuits was extremely low indicating that the de-capsulation process did not significantly swell the encapsulant to cause mechanical failure of the beam lead bonds. Testing of the circuits under an electrical bias at 85° C and 85% relative humidity also showed that the decapsulation process had no discernable effect on changes in the resistance of the tantalum nitride resistors nor did it appear to increase leakage currents over control circuits which were not decapsulated.

It was discovered that the concentration of tetramethylammonium hydroxide solution to 2-propanol ranging from 1:10 to 1:20 (2.2% –1.1% tetramethylammonium hydroxide) removed the encapsulant at about the same rate and is the preferred range. Greater dilution by 2-propanol would remove the encapsulant, but at a reduced rate which would not be recommended for commercial application. The same result was found when a 20% solution of tetramethylammonium hydroxide in methanol, sold by Aldrich Chemical Company, was used (1.8 –0.95% TMAH).

The rate of removal is also dependent on the temperature of the solution. It was found that an encapsulant with a thickness of approximately 0.015 inches will be removed in about 6 hours at 25° C, 2 hours at 38° C and 45 minutes at 54° C by a single immersion in the 1:10 stripping solution. As previously described, the temperature will also affect the height of the integrated circuit chips. Above approximately 55° C, the swelling begins to increase to unacceptable levels. Consequently, for a sufficient rate of removal with a minimum of swelling, the preferred temperature range is 25°–55° C. It was found that a temperature within the range 36°–40° C and immersion for 2–6 hours with mild agitation was particularly suited for commercial application.

It was also discovered that when partially stripped circuits are allowed to dry, the rubber is much more difficult to remove. Prior to drying, the rinsed circuits may be re-inserted into the stripping solutions to complete the stripping. Consequently, the circuits should preferably not be permitted to dry from the immersion in the stripping solution until the final rinsing and sample inspection for completeness of strip has been made.

Although the solution described comprises tetramethylammonium hydroxide, methanol, and 2-propanol in varying concentrations, it should be clear that other compositions may perform the same function. It appears that the 2-propanol serves as a means for allowing the tetramethylammonium hydroxide to enter the encapsulant. The tetramethylammonium hydroxide then cleaves the Si—O bonds of the cross-linked polymer and dissolves or disperses the resulting fragments. Consequently, it is expected that other alcohols with two of more carbon atoms may be used in place of the 2-propanol as long as they are liquid at room temperature. One example would be ethyl alcohol. In addition, the methanol is the initial solvent of the tetramethylammonium hydroxide since this solution is commercially available, but other types of solutions of tetramethylammonium hydroxide, such as those dissolved in other alcohols may be utilized.

Various additional modifications will become apparent to those skilled in the art. All such variations which basically rely on the teaching through which the invention has advanced the art are properly considered within the spirit and scope of the invention.

What is claimed is:

1. In a process for fabricating circuits formed in an insulating substrate, the method of removing silicone rubber encapsulants formed over said circuit comprising the step of applying to said encapsulant a solution consisting of tetramethylammonium hydroxide, methanol and 2-propanol.

2. The method according to claim 1 wherein the temperature of the solution is within the range 25°–55° C.

3. The method according to claim 1 wherein the concentration by volume of tetramethylammonium hydroxide and methanol to 2-propanol lies within the range 1:10 to 1:20.

4. The method according to claim 2 wherein the temperature of the solution is within the range 36°–40° C.

5. The method according to claim 1 wherein the circuit is successively immersed in different baths of said solution and thereafter rinsed by immersing in a material comprising isopropyl alcohol.

6. In a process for fabricating circuits formed on an insulating substrate, the method of removing silicone rubber encapsulants comprising siloxanes with methoxy end groups formed on said circuit comprising the steps of:

immersing the circuit in a first solution consisting of tetramethylammonium hydroxide, methanol and 2-propanol with a concentration by volume of tetramethylammonium hydroxide and methanol to 2-propanol within the range 1:10 to 1:20 at a temperature within the range 36°–40° C for a period of time within the range 2–6 hours;

removing said circuit from said first solution and immersing in a second solution of the same composition at a temperature within the range 36°–40° C for a period of time within the range 1–2 hours in order to remove any residue remaining after immersion in said first solution; and removing said circuit from said second solution and immersing in third and fourth solutions comprising isopropyl alcohol in order to rinse said circuit.

* * * * *